US012597942B2

(12) United States Patent
Zhou et al.

(10) Patent No.: US 12,597,942 B2
(45) Date of Patent: Apr. 7, 2026

(54) ANALOG-TO-DIGITAL CONVERTER, TOUCH SENSING CHIP AND ELECTRONIC DEVICE

(71) Applicant: SILEAD INC., Shanghai (CN)

(72) Inventors: Jinling Zhou, Shanghai (CN); Xianyin Yu, Shanghai (CN); Chenjun Weng, Shanghai (CN)

(73) Assignee: SILEAD INC., Shanghai (CN)

( * ) Notice: Subject to any disclaimer, the term of this patent is extended or adjusted under 35 U.S.C. 154(b) by 172 days.

(21) Appl. No.: 18/746,765

(22) Filed: Jun. 18, 2024

(65) Prior Publication Data

US 2025/0015811 A1      Jan. 9, 2025

(30) Foreign Application Priority Data

Jul. 7, 2023    (CN) .......................... 202310835395.6

(51) Int. Cl.
H03M 1/12 (2006.01)
H03M 1/46 (2006.01)

(52) U.S. Cl.
CPC ......... H03M 1/1245 (2013.01); H03M 1/122 (2013.01); H03M 1/462 (2013.01)

(58) Field of Classification Search
CPC ........ H03M 1/12; H03M 1/46; H03M 1/1245; H03M 1/462; H03M 1/122
See application file for complete search history.

(56) References Cited

U.S. PATENT DOCUMENTS

| | | | | | |
|---|---|---|---|---|---|
| 6,124,818 | A | * | 9/2000 | Thomas | H03M 1/164 |
| | | | | | 341/161 |
| 7,158,070 | B1 | * | 1/2007 | Yang | H03M 1/1019 |
| | | | | | 341/163 |
| 8,599,059 | B1 | * | 12/2013 | Chung | H03M 1/466 |
| | | | | | 341/172 |
| 9,425,818 | B1 | * | 8/2016 | Rajaee | H03M 3/32 |
| 9,685,973 | B2 | * | 6/2017 | Liu | H03M 1/38 |
| 10,826,520 | B1 | * | 11/2020 | Kumar Kundu | H03M 1/0863 |
| 10,951,225 | B1 | * | 3/2021 | Shannon | H03M 1/462 |
| 11,233,522 | B2 | * | 1/2022 | Mudegowdar | H03M 1/0607 |

(Continued)

*Primary Examiner* — Lam T Mai
(74) *Attorney, Agent, or Firm* — Ziegler IP Law Group, LLC.

(57) ABSTRACT

An analog-to-digital converter, a touch sensing chip and an electronic device are disclosed. The ADC includes a digital-to-analog conversion circuit, a comparator, a successive approximation register logic circuit and a residue sampling and summing circuit, the successive approximation register logic circuit coupled to output terminal of the comparator and control terminal of the digital-to-analog conversion circuit, the successive approximation register logic circuit configured to produce a corresponding quantized digital signal each time, based on the result of comparison from the comparator, the residue sampling and summing circuit configured to obtain a corresponding residue each time, by sampling residual voltage output from digital-to-analog conversion circuit, sum previous sampled residue and common reference voltage and provide the sum to the comparator, the comparator configured to compare a current output of the residue sampling and summing circuit with a current output of the digital-to-analog conversion circuit and thereby obtain current result of comparison.

12 Claims, 4 Drawing Sheets

(56)          References Cited

U.S. PATENT DOCUMENTS

| | | | | |
|---|---|---|---|---|
| 11,522,556 | B1 * | 12/2022 | Sheikholeslami | .... H03M 3/426 |
| 11,855,654 | B2 * | 12/2023 | Moeneclaey | ......... H03M 1/462 |
| 12,160,248 | B2 * | 12/2024 | Parupalli | ............... H03M 1/804 |
| 2003/0160714 | A1 * | 8/2003 | Yoshinaga | .......... H03M 1/1023 |
| | | | | 341/122 |
| 2014/0085122 | A1 * | 3/2014 | Jeon | .................... H03M 1/0678 |
| | | | | 341/158 |
| 2015/0061904 | A1 * | 3/2015 | Lee | .................... H03M 1/1245 |
| | | | | 341/118 |
| 2015/0162926 | A1 * | 6/2015 | Jung | .................... H03M 1/002 |
| | | | | 341/122 |
| 2015/0372691 | A1 * | 12/2015 | Mandal | ................... H03M 1/38 |
| | | | | 341/110 |
| 2022/0345145 | A1 * | 10/2022 | Nagaraj | ............. H03M 1/0607 |

* cited by examiner

ANALOG-TO-DIGITAL CONVERTER, TOUCH SENSING CHIP AND ELECTRONIC DEVICE

CROSS-REFERENCES TO RELATED APPLICATION

This application claims the priority of Chinese patent application number 202310835395.6, filed on Jul. 7, 2023, the entire contents of which are incorporated herein by reference.

TECHNICAL FIELD

The present disclosure relates to the field of touch sensing and, in particular, to an analog-to-digital converter, a touch sensing chip and an electronic device.

BACKGROUND

Analog-to-digital converters (ADCs) are circuits commonly used in applications requiring processing and analysis of optical, electrical, magnetic and other analog signals. ADCs can convert such analog signals into their digital representations and constrain the performance of signal processing processes in which they are employed. Different applications require ADCs with difference performance. ADCs suitable for use in touch sensing chips are typically successive approximation register analog-to-digital converters (SAR ADCs) with medium to high accuracy (about 12-bit), a medium speed (about 1 MSPS), low power consumption and a small area.

Referring to FIG. 1, a conventional SAR ADC is shown, which mainly includes a capacitive digital-to-analog conversion circuit CDAC, a comparator comp and a successive approximation register logic circuit SAR LOGIC. The CDAC converts an analog input signal Vin into a residual voltage Vp and provides the residual voltage Vp to the comparator comp, which then compares it and provides a result of comparison to SAR LOGIC. From the output of the comparator comp, SAR LOGIC derives a result of quantization with desired accuracy (measured in bits). This process is iteratively repeated.

SUMMARY OF THE INVENTION

The present disclosure provides an analog-to-digital converter including a digital-to-analog conversion circuit, a comparator, a successive approximation register logic circuit and a residue sampling and summing circuit, the successive approximation register logic circuit coupled to an output terminal of the comparator and a control terminal of the digital-to-analog conversion circuit, the successive approximation register logic circuit configured to produce a corresponding quantized digital signal each time, based on the result of comparison from the comparator, the digital-to-analog conversion circuit including an output terminal coupled to a first input terminal of the comparator, the digital-to-analog conversion circuit configured to receive a common reference voltage signal and a current analog input signal and produce a corresponding residual voltage based on the analog input signal and the common reference voltage, wherein the digital-to-analog conversion circuit is under the control of each quantized digital signal output from the successive approximation register logic circuit, the residue sampling and summing circuit including an input terminal coupled to the output terminal of the digital-to-analog conversion circuit and an output terminal coupled to a second input terminal of the comparator, the residue sampling and summing circuit configured to obtain a corresponding residue each time, by sampling the residual voltage output from the digital-to-analog conversion circuit, sum a previous sampled residue and the common reference voltage and provide the sum to the comparator, the comparator configured to compare a current output of the residue sampling and summing circuit with a current output of the digital-to-analog conversion circuit and thereby obtain a current result of comparison.

Optionally, the digital-to-analog conversion circuit may be a capacitive digital-to-analog conversion circuit including a plurality of capacitors and a plurality of switches, each of the switches coupled to a corresponding one of the capacitors, the switches turned on and off under the control of the quantized digital signal.

Optionally, capacitances of the capacitors in the digital-to-analog conversion circuit may form a geometric sequence with a common ratio of 2.

Optionally, the residue sampling and summing circuit may include two branches both coupled between the output terminal of the digital-to-analog conversion circuit and the second input terminal of the comparator, wherein as one of the branches is sampling a residual voltage output from the digital-to-analog conversion circuit, the other branch sums a previous sampled residue and the common reference voltage.

Optionally, each of the branches may include first to fourth switches and a sampling capacitor, a terminal of the first switch coupled to both the output terminal of the digital-to-analog conversion circuit and the first input terminal of the comparator, another terminal of the first switch coupled to a terminal of the sampling capacitor and a terminal of the second switch, another terminal of the sampling capacitor coupled to a terminal of the third switch and a terminal of the fourth switch, another terminal of the fourth switch coupled to a terminal of a reset switch and the second input terminal of the comparator, another terminal of the reset switch, another terminal of the second switch and another terminal of the third switch all coupled to the common reference voltage, first and third switches turned on and off simultaneously, the second and fourth switches turned on and off simultaneously, the second switch closed when the first switch is opened.

Optionally, when control terminals of the first and third switches are coupled to a first clock signal and control terminals of the second and fourth switches are coupled to a second clock signal in one of the branches, control terminals of the first and third switches may be coupled to the second clock signal and control terminals of the second and fourth switches to the first clock signal in the other branch, wherein the first and second clock signals are two-phase non-overlapping clock signals produced based on a sampling clock for the analog-to-digital converter.

The present disclosure also provides a touch sensing chip including:

charge amplifiers for converting a touch signal on a touch screen into an analog voltage signal;

programmable gain amplifiers for amplifying the analog voltage signal produced by the charge amplifiers and outputting the amplified signal into an analog input signal; and a plurality of analog-to-digital converters each as defined above for converting the analog input signal into a quantized digital signal.

Optionally, the touch sensing chip may further include digital filters including input terminals coupled to output terminals of the analog-to-digital converters, the digital filters configured to filter out high-frequency components of the quantized digital signal.

Optionally, the touch sensing chip may further include charge/discharge circuits coupled to respective sense channels in the touch screen and the charge amplifiers, the charge/discharge circuits configured to convert a touch signal on the sense channels into a sense voltage or sense charge by charging or discharging the sense channels and provide the sense voltage or sense charge to the charge amplifiers.

The present disclosure also provides an electronic device including a touch screen and the touch sensing chip as defined above. The touch screen includes at least two sense channels, and the touch sensing chip is coupled to each of the sense channels.

BRIEF DESCRIPTION OF THE DRAWINGS

Those of ordinary skill in the art would appreciate that the accompanying drawings are provided to facilitate a better understanding of the present disclosure and do not limit the scope thereof in any sense, in which.

DETAILED DESCRIPTION

Figure 1:
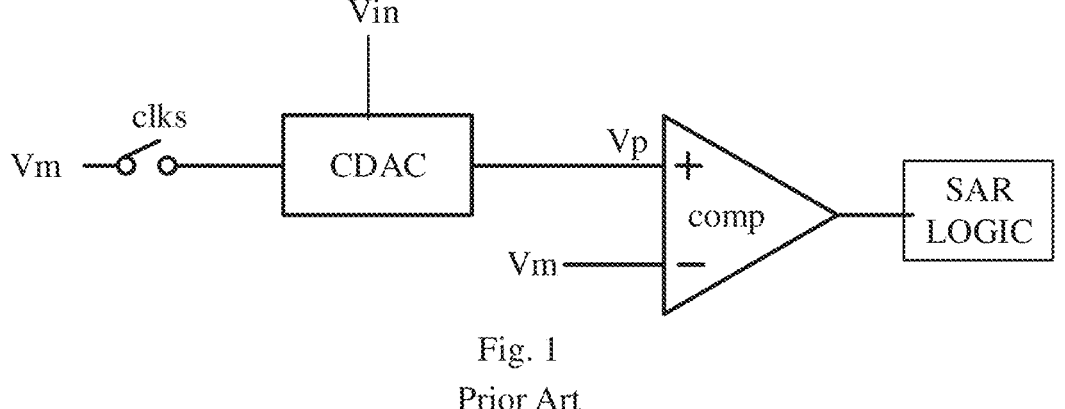
FIG. 1 illustrates a schematic circuit diagram of a conventional SAR ADC.

The following description sets forth numerous specific details in order to provide a more thorough understanding of the present disclosure. However, it will be apparent to those skilled in the art that the present disclosure can be practiced without one or more of these specific details. In other instances, well-known technical features have not been described in order to avoid unnecessary obscuring of the disclosure. It is to be understood that the disclosure may be embodied in many different forms and should not be construed as being limited to the embodiments set forth below. Rather, these embodiments are provided so that this disclosure is thorough and conveys the scope of the disclosure to those skilled in the art. In the drawings, like reference numerals refer to like elements throughout. It will be understood that when an element is referred to as being "connected to" or "coupled to" another element, it can be directly connected or coupled to the other element, or intervening elements may also be present. In contrast, when an element is referred to as being "directly connected to" another element, there are no intervening elements. As used herein, the singular forms "a", "an" and "the" are intended to include the plural forms as well, unless the context clearly indicates otherwise. It will be further understood that the term "comprising" specifies the presence of stated features, steps, operations, elements, and/or components, but do not preclude the presence or addition of one or more other features, steps, operations, elements, components, and/or groups thereof. As used herein, the term "and/or" includes any and all combinations of the associated listed items.

The present disclosure will be described in greater detail below by way of specific embodiments with reference to FIGS. 2 to 6. From the following description, advantages and features of the disclosure will become more apparent. Note that the figures are provided in a very simplified form not necessarily drawn to exact scale and only for the sake of easier and clearer description of the embodiments disclosed herein.

Figure 2:
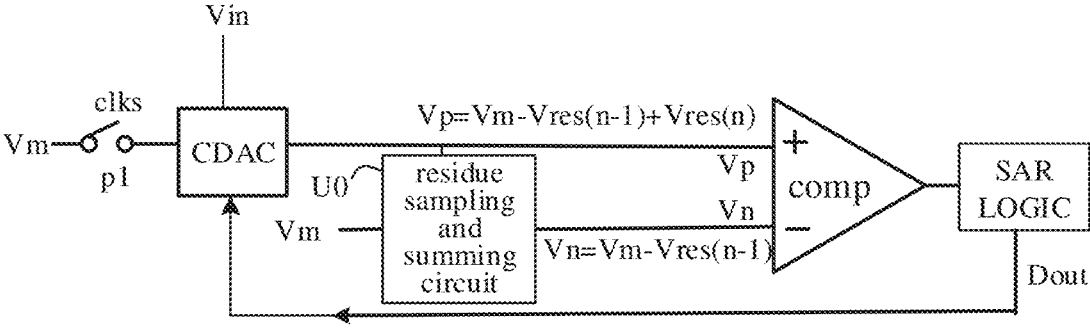
FIG. 2 illustrates a schematic diagram showing the architecture of an analog-to-digital converter according to an embodiment of the present disclosure.

Referring to FIG. 2, an analog-to-digital converter according to an embodiment of the present disclosure is shown, which includes a digital-to-analog conversion circuit CDAC, a comparator comp, a successive approximation register logic circuit SAR LOGIC and a residue sampling and summing circuit U0.

An input terminal of the successive approximation register logic circuit SAR LOGIC is coupled to an output terminal of the comparator comp, and an output terminal of the successive approximation register logic circuit SAR LOGIC is coupled to a control terminal of the digital-to-analog conversion circuit CDAC. The successive approximation register logic circuit SAR LOGIC is configured to produce a quantized digital signal Dout from each result of comparison from the comparator comp.

An output terminal of the digital-to-analog conversion circuit CDAC is coupled to a first input terminal (e.g., non-inverting (+) input terminal) of the comparator comp. Another terminal of the digital-to-analog conversion circuit CDAC is coupled to a terminal of a sampling switch p1, and another terminal of the sampling switch p1 receives a common reference voltage Vm (also known as a common-mode voltage) for the analog-to-digital converter. Yet another terminal of the digital-to-analog conversion circuit CDAC receives the current analog input signal Vin. A control terminal of the sampling switch p1 is under the control of a sampling clock clks for the analog-to-digital converter. The digital-to-analog conversion circuit CDAC is configured to produce a residual voltage Vp based on the analog input signal Vin and the common reference voltage Vm under the control of each quantized digital signal Dout output from the successive approximation register logic circuit SAR LOGIC and provide it at the first input terminal of the comparator comp.

An input terminal of the residue sampling and summing circuit U0 is coupled to an output terminal of the digital-to-analog conversion circuit CDAC and the first input terminal of the comparator comp, and an output terminal of the residue sampling and summing circuit U0 is coupled to a second input terminal (e.g., an inverting (−) input terminal) of the comparator comp. The residue sampling and summing circuit U0 is configured to sample each residual voltage Vp output from the digital-to-analog conversion circuit CDAC and thereby obtain a corresponding residue Vres. It is also configured to provide the sum of the previous sampled residue Vres and the common reference voltage Vm (Vm−

Vres) to the comparator comp. When denoting the previous sampled residue as Vres(n−1) and the current sampled residue as Vres(n), a voltage present at the second input terminal of the comparator comp is Vn=Vm−Vres, and a voltage at the first input terminal of the comparator comp is Vp=Vn+Vres(n)=Vm−Vres(n−1)+Vres(n). Vres(n) reflects the magnitude of the current analog input signal Vin.

The comparator comp is configured to compare the voltage Vp at its first input terminal with the voltage Vn at its second input terminal and output a result of comparison to the successive approximation register logic circuit SAR LOGIC.

The analog-to-digital converter (ADC) of this embodiment is a noise-shaping (NS) successive approximation register (SAR) ADC of an error-feedback (EF) structure. When denoting the current analog input signal of the analog-to-digital converter as Vin(n), the current output quantized digital signal as Dout(n), the current sampled residue of the residue sampling and summing circuit U0 as Vres(n) and the previous sampled residue (i.e., the previous result of quantization, for example, the result of quantization from the last time) as Vres(n−1), an in-out expression for the analog-to-digital converter is $$V_{in}(n) = D_{out}(n) + V_{res}(n) - V_{res}(n-1).$$

Applying a Z-transform to the above equation, we obtain:

$$V_{in}(z) = D_{out}(z) + V_{res}(z)(1 - z^{-1}).$$

The analog-to-digital converter applies first-order noise shaping to residues, and the quantized residue is the current analog input signal minus the previous result of quantization. The residue is summed with the current analog input signal at the input terminal comparator.

It would be appreciated that each of the digital-to-analog conversion circuit CDAC, the comparator comp, the successive approximation register logic circuit SAR LOGIC and the residue sampling and summing circuit U0 may be of any suitable circuit design known in the art, as long as they can provide the functions required by the present disclosure. The present disclosure is not particularly limited in this regard.

Figure 3:
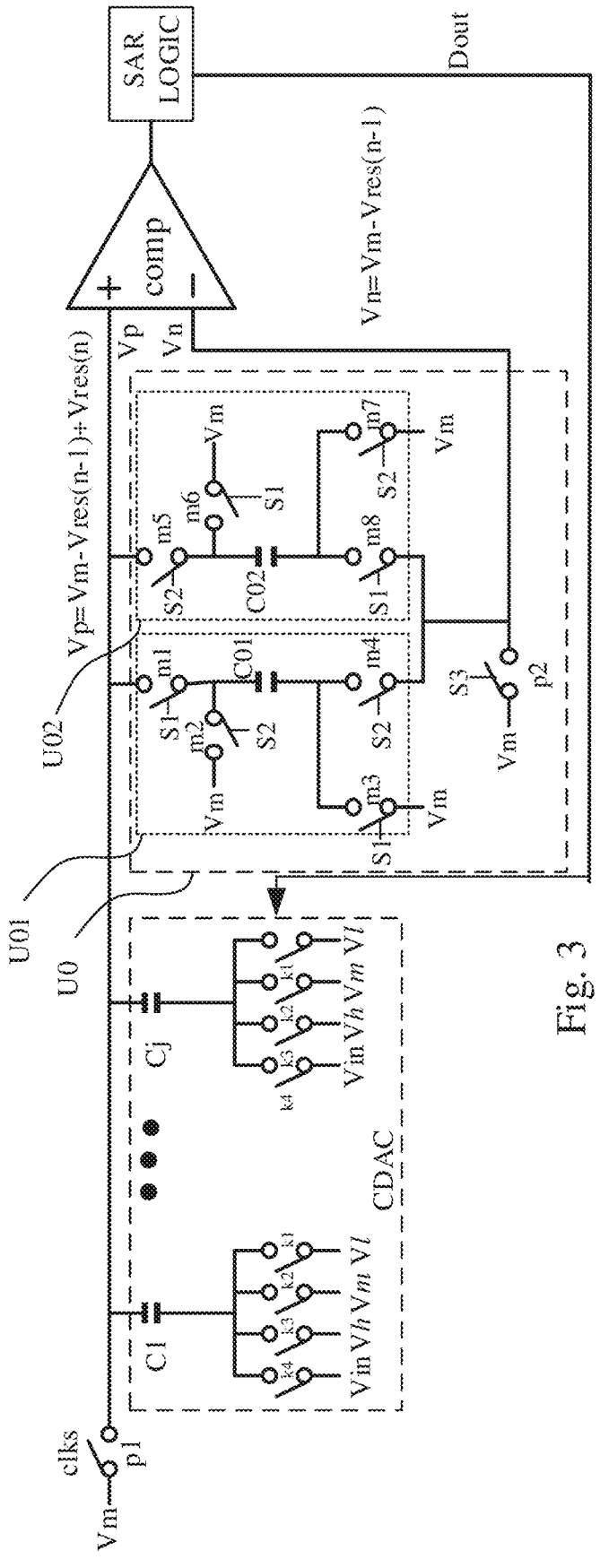
FIG. 3 illustrates a schematic diagram showing the structure of a specific example of the analog-to-digital converter of FIG. 2.

As an example, referring to FIG. 3, the digital-to-analog conversion circuit CDAC is implemented as a capacitive digital-to-analog conversion circuit, which may include j capacitors C1-Cj and a plurality of switches. These switches are adaptively coupled to corresponding capacitors and turned on and off under the control of the quantized digital signal Dout output from the successive approximation register logic circuit SAR LOGIC. Capacitances of the capacitors C1-Cj may form a geometric sequence with common ratio 2. For example, C1=C; C2=2*C1=$2^1$*C; C3=2*C2=$2^2$*C; . . . ; and Cj=$2^{j-1}$*C.

Further, for example, top plates of all the capacitors C1-Cj are coupled to a terminal of the sampling switch p1 and the first input terminal of the comparator comp, and a bottom plate of each of the capacitors is coupled to a terminal of each of 4 switches k1-k4. Another terminal of the switch k1 is coupled to a lower voltage limit Vl, and another terminal of the switch k2 is coupled to the common reference voltage Vm. Another terminal of the switch k3 is coupled to an upper voltage limit Vh, and another terminal of the switch k4 is coupled to the current analog input signal Vin. Control terminals of the switches k1-k4 are all coupled to the quantized digital signal Dout output from the successive approximation register logic circuit SAR LOGIC. Another terminal of the sampling switch p1 receives the common reference voltage Vm, and the control terminal of the sampling switch p1 receives the sampling clock clks for the analog-to-digital converter. During a sampling phase of the analog-to-digital converter, clks is high, a potential of the top plates of the capacitors C1-Cj is reset to Vm, and the bottom plates of the capacitors C1-Cj are coupled to Vin. During a converting phase of the analog-to-digital converter, clks is low, and the bottom plates of the capacitors C1-Cj are coupled to Vh, Vl or Vm under the control of the quantized digital signal Dout.

As an example, referring to FIG. 3, the residue sampling and summing circuit U0 includes a reset switch p2 and two branches U01, U02 coupled between the output terminal of the digital-to-analog conversion circuit CDAC and the second input terminal of the comparator comp. As the branch U01 is sampling a residual voltage Vp output from the digital-to-analog conversion circuit CDAC, the branch U02 sums the previous sampled residue Vres and the common reference voltage Vm and provides Vn=Vm-Vres to the second input terminal of the comparator comp. As the branch U02 is sampling a residual voltage Vp output from the digital-to-analog conversion circuit CDAC, the branch U01 sums the previous sampled residue Vres and the common reference voltage Vm and provides Vn=Vm-Vres to the second input terminal of the comparator comp.

Further, for example, the branches U01 and U02 each include first to fourth switches and a sampling capacitor. The branch U01 includes a first switch m1, a second switch m2, a third switch m3, a fourth switch m4 and a sampling capacitor C01. A terminal of the first switch m1 is coupled to the output terminal of the digital-to-analog conversion circuit CDAC and the first input terminal of the comparator comp. Another terminal of the first switch m1 is coupled to a terminal of the sampling capacitor C01 and a terminal of the second switch m2. Another terminal of the sampling capacitor C01 is coupled to a terminal of the third switch m3 and a terminal of the fourth switch m4. Another terminal of the fourth switch m4 is coupled to a terminal of the reset switch p2 and the second input terminal of the comparator comp. Another terminal of the reset switch p2, another terminal of the second switch m2 and another terminal of the third switch m3 are all coupled to the common reference voltage Vm. The branch U02 includes a first switch m5, a second switch m6, a third switch m7, a fourth switch m8 and a sampling capacitor C02. A terminal of the first switch m5 is coupled to the output terminal of the digital-to-analog conversion circuit CDAC and the first input terminal of the comparator comp. Another terminal of the first switch m5 is coupled to a terminal of the sampling capacitor C02 and a terminal of the second switch m6. Another terminal of the sampling capacitor C02 is coupled to a terminal of the third switch m7 and a terminal of the fourth switch m8. Another terminal of the fourth switch m8 is coupled to a terminal of the reset switch p2 and the second input terminal of the comparator comp. Another terminal of the second switch m6 and another terminal of the third switch m7 are both coupled to the common reference voltage Vm. A control terminal of the reset switch p2 receives a reset clock signal S3.

Control terminals of the first switch m1 and the third switch m3 in U01 are coupled to a first clock signal S1. Control terminals of the second switch m2 and the fourth switch m4 in U01 are coupled to a second clock signal S2.

Control terminals of the first switch m5 and the third switch m7 in U02 are coupled to the second clock signal S2. Control terminals of the second switch m6 and the fourth switch m8 in U02 are coupled to the first clock signal S1. The first clock signal S1 and the second clock signal S2 are two-phase non-overlapping clock signals produced from the sampling clock clks for the analog-to-digital converter. With this arrangement, the first switch m1 and the third switch m3 in U01 are turned on and off simultaneously with the second switch m6 and the fourth switch m8 in U02, and the second switch m2 and the fourth switch m4 in U01 are turned on and off simultaneously with the first switch m5 and the third switch m7 in U02. Further, when the first switch m1 is opened, the second switch m2 is closed.

Figure 4:
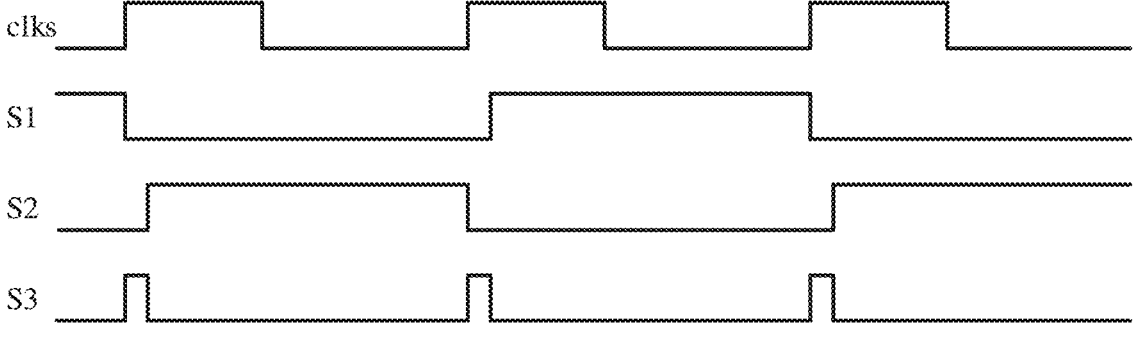
FIG. 4 illustrates a schematic timing diagram showing operation of the analog-to-digital converter of FIG. 3.

With combined reference to the timing diagram shown in FIG. 4, operation of the residue sampling and summing circuit U0, for example, over successive (n−1)-th and n-th residue sampling cycles in accordance with this embodiment is described below.

In the (n−1)-th residue sampling cycle, when clks and S3 are high and S1 and S2 are low, a reset action is taken so that Vn=Vm. In response, S2 transitions high and S3 transitions low, closing m5, m7, m2 and m4 and turning off m1, m3, m6 and m8. C2 is coupled to and samples Vp, obtaining an (n−1)-th residue Vres(n−1). Moreover, C1 is coupled to Vn and sums the previous sampled residue Vres(n−2) and Vm, obtaining Vn=Vm−Vres(n−2). Following that, clk transitions low, ending the (n−1)-th residue sampling cycle.

The next n-th sampling cycle starts when clks transitions high again. S3 transitions high, S1 remains low, and S2 transitions low. Another reset action is taken so that Vn=Vm. After that, S1 transitions high and S3 transitions low, closing m1, m3, m6 and m8 and turning off m5, m7, m2 and m4. As a result, C1 is coupled to and samples Vp, obtaining an n-th residue Vres(n). Moreover, C2 is coupled to Vn and sums the previous sampled residue Vres(n−1) and Vm, obtaining Vn=Vm−Vres(n−1). Following that, clk transitions low, ending the n-th residue sampling cycle.

As can be seen from the above description of operation of the residue sampling and summing circuit U0, in the residue sampling and summing circuit U0 according to this embodiment, when C1 is coupled to and samples Vp to obtain a residue, C2 is coupled to Vn and sums the previous sampled residue and Vm. On the contrary, when C2 is coupled to and samples Vp to obtain a residue, C1 is coupled to Vn and sums the previous sampled residue and Vm. Since the residue sampling and summing circuit U0 is constructed from only the sampling capacitors and a plurality of switches, it is simple in structure.

In addition, since there is small parasitic capacitance Cpar at the second (inverting) input terminal of the comparator comp, residue attenuation can be neglected during summation as long as C1/C2 is much greater than Cpar.

It is only necessary for the analog-to-digital converter ADC of this embodiment to additionally include the residue sampling and summing circuit U0, without using any amplifier.

Figure 5:
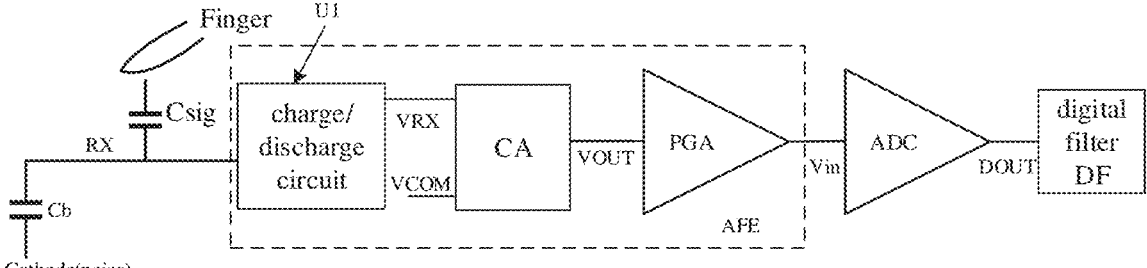
FIG. 5 illustrates a schematic diagram showing the architecture of a touch sensing chip according to an embodiment of the present disclosure.
Figure 6:
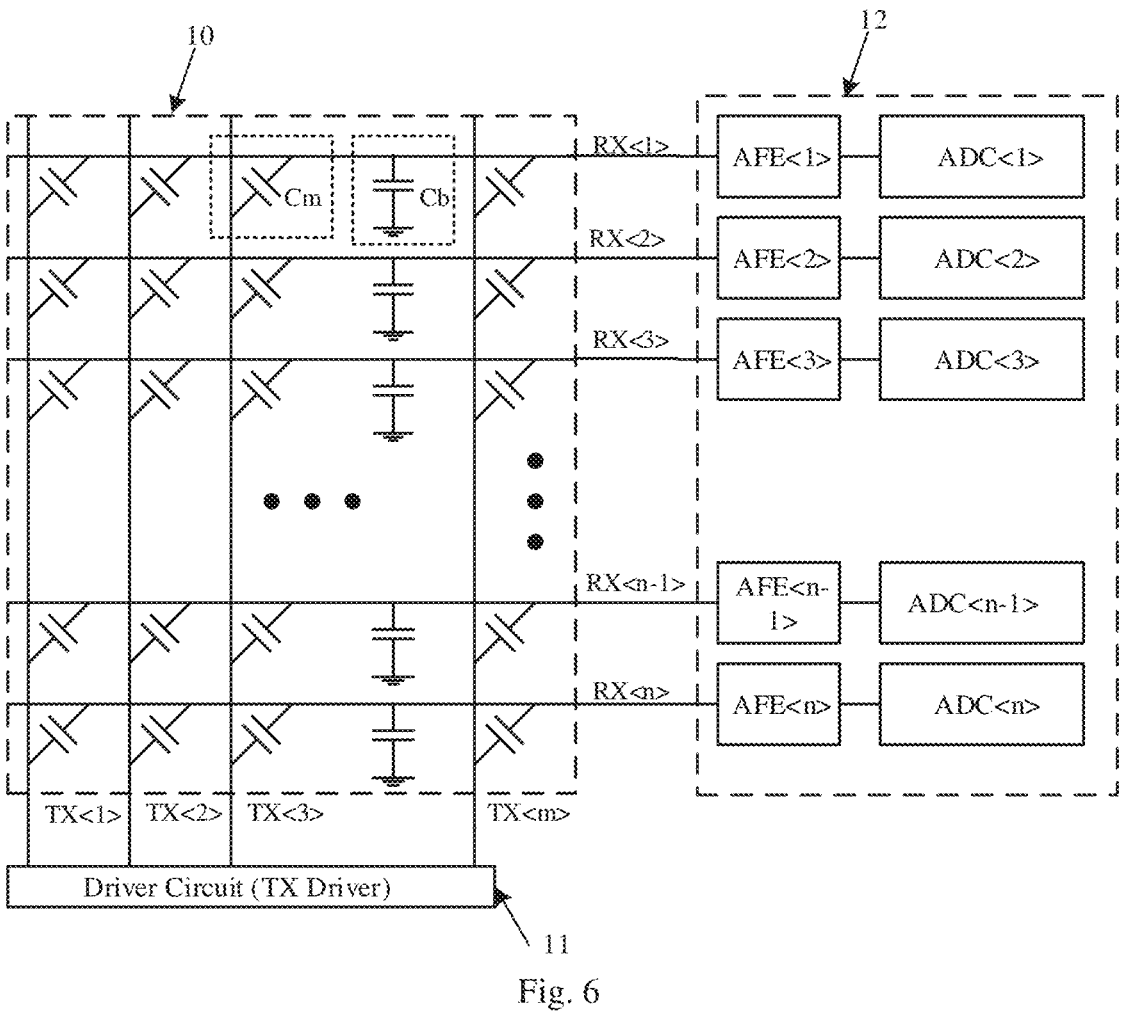
FIG. 6 illustrates a schematic diagram showing the structure of an electronic device according to an embodiment of the present disclosure.

Referring to FIGS. 5 and 6, in an embodiment of the present disclosure, there is also provided a touch sensing chip, which may operate either in a self-capacitance mode or in a mutual capacitance mode. For example, it may include charge amplifiers CA, programmable gain amplifiers PGA and the inventive analog-to-digital converters ADC as discussed herein. The charge amplifiers CA are configured to convert a touch signal Csig (self-capacitance) or Cm-Csig (equivalent mutual capacitance between transmit TX and sense RX channels in a touch screen 10) on the touch screen

10 into an analog voltage signal VOUT. The programmable gain amplifiers PGA are configured to amplify the analog voltage signal VOUT produced by the charge amplifier CA and output the amplified signal as an analog input signal Vin. The analog-to-digital converters ADC are configured to convert the analog input signal Vin into a quantized digital signal DOUT.

Optionally, the touch sensing chip may further include digital filters DF with input terminals coupled to the output terminals of the analog-to-digital converters ADC, which are configured to filter out high-frequency components in the quantized digital signal DOUT.

Optionally, the touch sensing chip may further include charge/discharge circuits U1, which are coupled to the respective sense channels RX in the touch screen 10 and the charge amplifiers CA and configured to charge or discharge the sense channels RX to convert a touch signal on the sense channels RX into a sense voltage VRX or sense charge and provide it to the charge amplifiers CA.

A touch detection circuit 12 is configured to detect capacitance variation in the touch screen 10. Results of detection of the touch detection circuit 22 can be used to determine the location of a touch event occurring on the touch screen 10 and a user's touch operation.

In this embodiment, the touch sensing chip may include a driver circuit 11 coupled to the transmit channels TX and the touch detection circuit 12 coupled to the sense channels RX. The touch detection circuit 12 may include a number of touch detection branches. The number of touch detection branches is equal to that of sense channels RX, and each of the touch detection branches is coupled to a respective one of the sense channels RX. Each touch detection branch includes one of the charge/discharge circuits U1, one of the charge amplifiers CA, one of the programmable gain amplifiers PGA and one of the analog-to-digital converters ADC, which are coupled in sequence. The charge/discharge circuits U1, the charge amplifiers CA and the programmable gain amplifiers PGA make up front-end circuits AFE of the analog-to-digital converters ADC.

For example, the touch screen 10 may be an OLED touch screen or any other touch screen, which has m longitudinally running transmit channels TX (i.e., TX<1>-TX<m>) and n transversely running sense channels RX (i.e., RX<1>–RX<n>). The transmit channels TX cross the sense channels RX at sense nodes, and both m and n depend on the size and shape of the touch screen 10. An input terminal of the front-end circuit AFE<1> is coupled to the sense channel RX<1>, and an output terminal of the front-end circuit AFE<1> is coupled to an input terminal of the analog-to-digital converter ADC<1>; an input terminal of the front-end circuit AFE<2> is coupled to the sense channel RX<2>, and an output terminal of the front-end circuit AFE<2> is coupled to an input terminal of the analog-to-digital converter ADC<2>; . . . ; and an input terminal of the front-end circuit AFE<n> is coupled to the sense channel RX<n>, and an output terminal of the front-end circuit AFE<n> is coupled to an input terminal of the analog-to-digital converter ADC<n>.

It would be appreciated that although the touch detection branches have been described above in this embodiment as being coupled to the respective sense channels RX, the present disclosure is not so limited. In other embodiments of the present disclosure, at least part of one touch detection branch may be commonly shared by multiple sense channels RX. For example, multiple PGAs may be coupled to a single ADC. As another embodiment, a single charge/discharge circuit U1 may be coupled to multiple PGAs. Any circuit design can be suitably used, as long as the charge/discharge circuits U1, the charge amplifiers CA and the programmable gain amplifiers PGA can perform their intended functions. Therefore, in this embodiment, the charge/discharge circuit U1, the charge amplifiers CA and the programmable gain amplifiers PGA may each be of any suitable circuit design.

Referring to FIG. 6, in an embodiment of the present disclosure, there is also provided an electronic device, which includes a touch screen 10 and the inventive touch sensing chip as defined herein. The touch screen 10 includes a number of sense channels RX, and the touch sensing chip is coupled to each of the sense channels RX.

The description presented above is merely that of a few preferred embodiments of the present disclosure and is not intended to limit the scope thereof in any sense. Any and all changes and modifications made by those of ordinary skill in the art based on the above teachings fall within the scope as defined in the appended claims.

What is claimed is:

1. An analog-to-digital converter, comprising a digital-to-analog conversion circuit, a comparator, a successive approximation register logic circuit and a residue sampling and summing circuit, the successive approximation register logic circuit coupled to an output terminal of the comparator and a control terminal of the digital-to-analog conversion circuit, the successive approximation register logic circuit configured to produce a corresponding quantized digital signal each time, based on the result of comparison from the comparator, the digital-to-analog conversion circuit comprising an output terminal coupled to a first input terminal of the comparator, the digital-to-analog conversion circuit configured to receive a common reference voltage signal and a current analog input signal and produce a corresponding residual voltage based on the analog input signal and the common reference voltage, wherein the digital-to-analog conversion circuit is under the control of each quantized digital signal output from the successive approximation register logic circuit, the residue sampling and summing circuit comprising an input terminal coupled to the output terminal of the digital-to-analog conversion circuit and an output terminal coupled to a second input terminal of the comparator, the residue sampling and summing circuit configured to obtain a corresponding residue each time, by sampling the residual voltage output from the digital-to-analog conversion circuit, sum a previous sampled residue and the common reference voltage and provide the sum to the comparator, the comparator configured to compare a current output of the residue sampling and summing circuit with a current output of the digital-to-analog conversion circuit and thereby obtain a current result of comparison.

2. The analog-to-digital converter of claim 1, wherein the digital-to-analog conversion circuit is a capacitive digital-to-analog conversion circuit, the capacitive digital-to-analog conversion circuit comprising a plurality of capacitors and a plurality of switches, each of the switches coupled to a corresponding one of the capacitors, the switches turned on and off under the control of the quantized digital signal.

3. The analog-to-digital converter of claim 2, wherein capacitances of the capacitors in the digital-to-analog conversion circuit form a geometric sequence with a common ratio of 2.

4. The analog-to-digital converter of claim 2, wherein top plates of all the capacitors are coupled to the first input terminal of the comparator, and a bottom plate of each of the capacitors is coupled to a terminal of each of four switches.

5. The analog-to-digital converter of claim 1, wherein the residue sampling and summing circuit comprises two branches both coupled between the output terminal of the digital-to-analog conversion circuit and the second input terminal of the comparator, and wherein as one of the branches is sampling a residual voltage output from the digital-to-analog conversion circuit, the other branch sums a previous sampled residue and the common reference voltage.

6. The analog-to-digital converter of claim 5, wherein each of the branches comprises first, second, third and fourth switches and a sampling capacitor, a terminal of the first switch coupled to both the output terminal of the digital-to-analog conversion circuit and the first input terminal of the comparator, another terminal of the first switch coupled to a terminal of the sampling capacitor and a terminal of the second switch, another terminal of the sampling capacitor coupled to a terminal of the third switch and a terminal of the fourth switch, another terminal of the fourth switch coupled to a terminal of a reset switch and the second input terminal of the comparator, another terminal of the reset switch, another terminal of the second switch and another terminal of the third switch all coupled to the common reference voltage, the first and third switches turned on and off simultaneously, the second and fourth switches turned on and off simultaneously, the second switch closed when the first switch is opened.

7. The analog-to-digital converter of claim 6, wherein when control terminals of the first and third switches are coupled to a first clock signal and control terminals of the second and fourth switches are coupled to a second clock signal in one of the branches, control terminals of the first and third switches are coupled to the second clock signal and control terminals of the second and fourth switches are coupled to the first clock signal in the other branch, wherein the first and second clock signals are two-phase non-overlapping clock signals produced based on a sampling clock for the analog-to-digital converter.

8. The analog-to-digital converter of claim 6, wherein a control terminal of the reset switch receives a reset clock signal.

9. A touch sensing chip, comprising:

charge amplifiers for converting a touch signal on a touch screen into an analog voltage signal;

programmable gain amplifiers for amplifying the analog voltage signal produced by the charge amplifiers and outputting the amplified signal into an analog input signal; and a plurality of analog-to-digital converters each as defined in claim 1 for converting the analog input signal into a quantized digital signal.

10. The touch sensing chip of claim 9, further comprising digital filters comprising input terminals coupled to output terminals of the analog-to-digital converters, the digital filters configured to filter out high-frequency components of the quantized digital signal.

11. The touch sensing chip of claim 9, further comprising charge/discharge circuits coupled to respective sense channels in the touch screen and the charge amplifiers, the charge/discharge circuits configured to convert a touch signal on the sense channels into a sense voltage or sense charge by charging or discharging the sense channels and provide the sense voltage or sense charge to the charge amplifiers.

12. An electronic device, comprising a touch screen and the touch sensing chip of claim 9, the touch screen comprising at least two sense channels, the touch sensing chip coupled to each of the sense channels.

* * * * *